(12) United States Patent
Hynecek

(10) Patent No.: US 8,274,587 B2
(45) Date of Patent: Sep. 25, 2012

(54) IMAGE SENSOR PIXELS WITH VERTICAL CHARGE TRANSFER

(75) Inventor: Jaroslav Hynecek, Allen, TX (US)

(73) Assignee: Aptina Imaging Corporation, George Town (KY)

( * ) Notice: Subject to any disclaimer, the term of this patent is extended or adjusted under 35 U.S.C. 154(b) by 268 days.

(21) Appl. No.: 12/758,995

(22) Filed: Apr. 13, 2010

(65) Prior Publication Data
US 2011/0249158 A1 Oct. 13, 2011

(51) Int. Cl.
| H04N 9/083 | (2006.01) |
| H04N 3/14 | (2006.01) |
| H04N 5/335 | (2011.01) |
| H04N 9/04 | (2006.01) |
| H01L 31/062 | (2012.01) |
| H01L 31/113 | (2006.01) |

(52) U.S. Cl. ............... 348/296; 348/276; 257/291
(58) Field of Classification Search ............ 348/294, 348/296, 308–310; 257/257-8, 290–1
See application file for complete search history.

(56) References Cited

U.S. PATENT DOCUMENTS

| 3,971,065 A | 7/1976 | Bayer |
| 6,657,665 B1 | 12/2003 | Guidash |
| 6,894,265 B2 | 5/2005 | Merrill et al. |
| 7,816,170 B2 * | 10/2010 | Lee et al. ............... 438/75 |
| 2007/0012970 A1 * | 1/2007 | Mouli ............... 257/292 |
| 2007/0023801 A1 | 2/2007 | Hynecek |
| 2007/0215921 A1 * | 9/2007 | Hsu et al. ............... 257/290 |
| 2008/0106625 A1 * | 5/2008 | Border et al. ............... 348/296 |
| 2009/0303371 A1 * | 12/2009 | Watanabe et al. ............... 348/311 |

* cited by examiner

*Primary Examiner* — Daniel M Pasiewicz
(74) *Attorney, Agent, or Firm* — Treyz Law Group; Jason Tsai

(57) ABSTRACT

Image sensors having image sensor pixels with stacked photodiodes are provided. An image sensor pixel may include a shallow potential well located in a shallow implant region and a deep potential well located in a deep implant region. The shallow implant region and the deep implant region may be separated by a potential barrier. The image sensor pixel may have a given transfer gate to transfer charge from the shallow well to a floating diffusion node. The image sensor pixel may have an additional transfer gate to transfer charge from the deep well to the shallow well via a vertical transfer region located under the additional transfer gate. Image sensor pixels formed using this structure may exhibit higher pixel densities, higher image resolution, and higher sensitivity.

13 Claims, 4 Drawing Sheets

IMAGE SENSOR PIXELS WITH VERTICAL
CHARGE TRANSFER

BACKGROUND

The present invention relates to image sensors, and more specifically, to image sensors that provide vertical charge transfer.

Image sensors are commonly used in electronic devices such as cellular telephones, cameras, and computers to capture images. Color sensing schemes commonly used with conventional image sensors involve forming color filter arrays on top of the image sensors. The color filter arrays include tiles incorporating various colored dyes for color filtering. An example of a color filter array pattern that may be used is the GRGB (green-red-green-blue) Bayer pattern.

Image sensors have arrays of image sensor pixels with which the image sensor generates data corresponding to the captured images. Each respective image sensor pixel associated with a given pixel sub-array does not have the capability to differentiate among various types of light according to its wavelength. Placing color filters over the pixels allows the pixels to be sensitive to a certain range of wavelength in the visible spectrum (e.g., an image pixel is sensitive to green light, red light, or blue light). Sensing color using this approach therefore sacrifices sensitivity by absorbing light with the color filters. It would therefore be desirable to be able to provide image sensors with improved sensitivity.

DETAILED DESCRIPTION

Digital camera modules are widely used in electronic devices such as digital cameras, computers, cellular telephones, or other electronic devices. These electronic devices may include image sensors that receive incoming light to capture an image. The image sensors may include arrays of image sensor pixels. The pixels in the image sensors may include photosensitive elements such as photodiodes that convert the incoming light into electrons and then into digital data. Image sensors may have any number of pixels (e.g., hundreds or thousands or more). A typical image sensor may, for example, have millions of pixels (e.g., megapixels). In high-end equipment, image sensors with ten megapixels or more are not uncommon.

Figure 1:
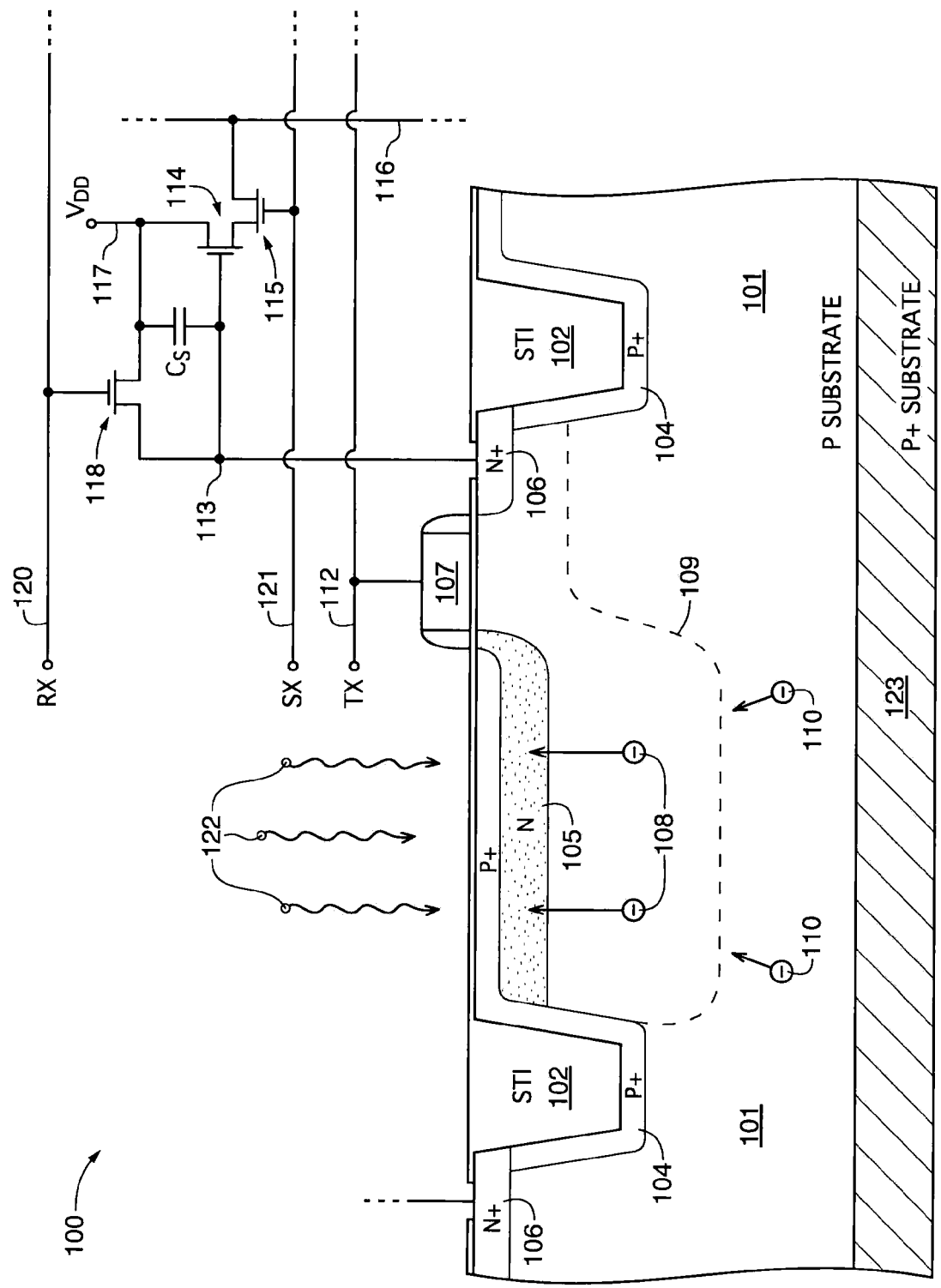
FIG. 1 shows a cross-sectional side view of a photodiode in a conventional image sensor pixel including an associated image sensor pixel circuit diagram.

FIG. 1 shows a cross-sectional side view of an image pixel 100 with a conventional photodiode. FIG. 1 also shows a circuit diagram of an associated pixel circuit. P-type silicon layer 101 is formed on p+ substrate 123. Substrate 101 has shallow trench isolation (STI) regions 102 that are formed in its surface and that are filled with silicon dioxide. The silicon dioxide also covers the remaining surface of the pixel. A shallow p+ doped region 104 passivates the walls and the bottom of STI regions 102 and passivates the surface of the pixel.

Charge generated by impinging photons is collected in n-type doped region 105 of the photodiode. Charge can be transferred from region 105 to floating diffusion region 106 (i.e., an n+ doped region) by turning transfer gate 107 momentarily on. The floating diffusion region is reset by transistor 118 to positive power supply voltage $V_{DD}$ supplied over power supply line 117. The voltage change due to charge stored in region 106 is sensed by transistor 114.

Capacitor Cs is connected between supply line 117 and floating diffusion node 113. Capacitor Cs is used to adjust the conversion gain of the pixel. The pixel is addressed via select transistor 115. Control signals are supplied to pixel 100 via a transfer (Tx) gate line 112, a reset (Rx) gate line 120, and an address (Sx) gate line 121. The pixel outputs data to a pixel column line 116.

When photons 122 impinge on pixel 100, photons 122 penetrate into the silicon substrate depending on their respective wavelengths and generate electron-hole pairs. N-type doped region 105 has an associated depletion region with a depletion boundary 109. Electrons 108 that are generated within the depletion region are collected in region 105. Electrons 110 that are generated in an undepleted region of substrate 101 diffuse to edge 109 of the depletion region. Electrons 110 at edge 109 of the depletion region are quickly swept into the potential well of n-type region 105. Electrons 110 generated in the neutral undepleted region can diffuse laterally and contribute to the pixel cross talk.

Pixel 100 of FIG. 1 has no ability to separate charge according to its depth of generation (i.e., pixel 100 has no ability to separate charge according to the wavelength of the impinging photons). It is therefore necessary to place color filters on top of these pixels to create the desired color sensing ability. Filtering light results in an undesirable loss of sensitivity.

For example, a Bayer filter configuration is often formed over a pixel subgroup. The Bayer filter arrangement is a color filter array that has a filter pattern that is 50% green, 25% red, and 25% blue. This arrangement is referred to as a GRGB (green-red-green-blue) color filter. Each pixel formed under the Bayer filter configuration loses approximately 66% sensitivity, because only one of three ranges of wavelengths is passed through each color filter to a respective pixel. A green filter passes green light while absorbing red light and blue light, as an example.

Figure 2:
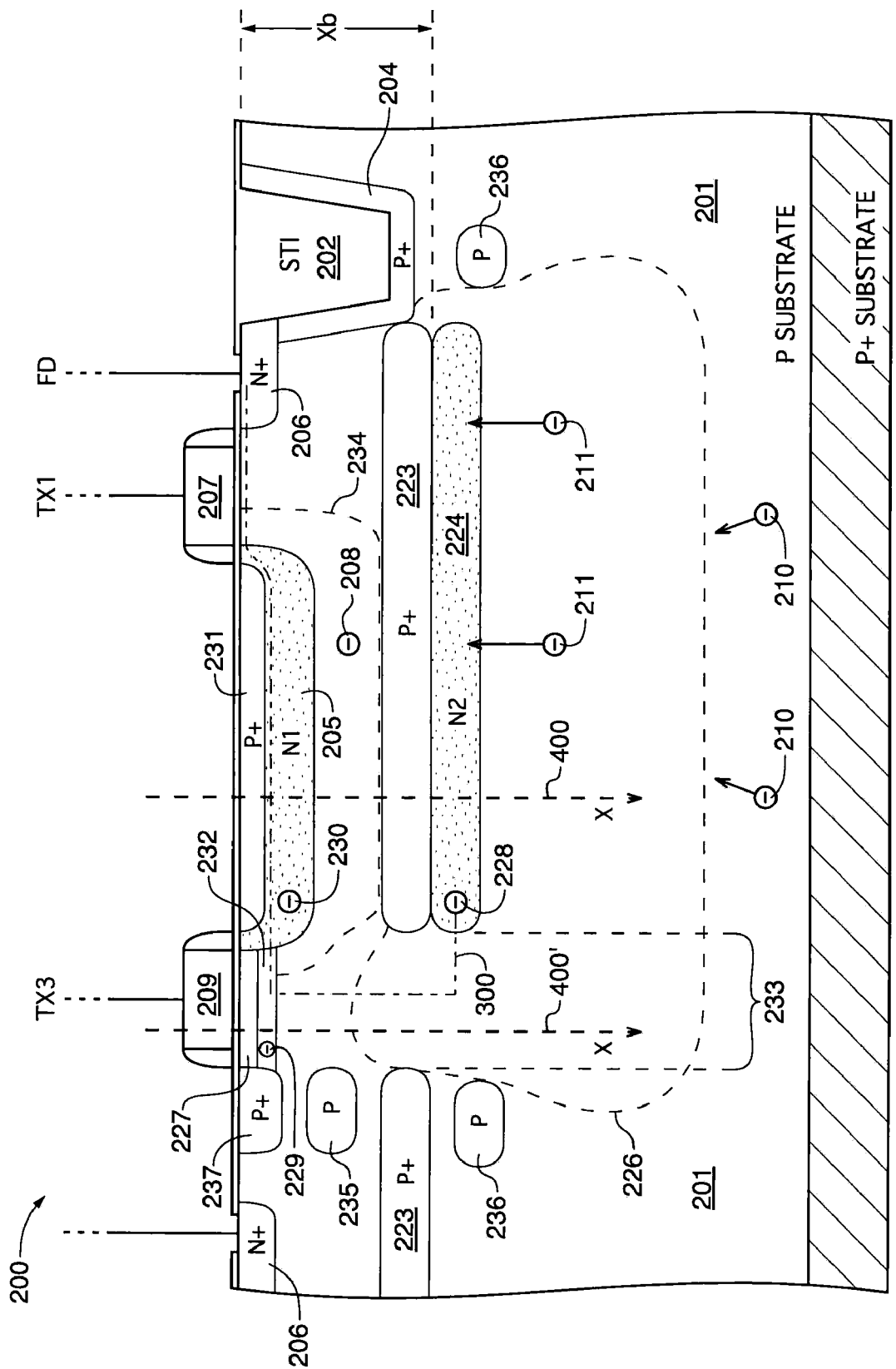
FIG. 2 is a cross-sectional side view of an illustrative photodiode that has a vertical charge transfer region in accordance with an embodiment of the present invention.

FIG. 2 is a cross-sectional side view of an illustrative image sensor pixel that has the ability to separate charge according to its depth of generation. Pixel circuits of the type shown in FIG. 1 (e.g., the reset transistor, the sensing transistor, the address transistor, and other circuits of FIG. 1) are typically connected to the floating diffusion regions of FIG. 2, but are omitted in FIG. 2 to avoid over-complicating the drawing.

Pixel 200 may be formed in p-type epitaxial silicon substrate 201. Substrate 201 may include shallow trench isolation (STI) regions 202 etched in its surface. STI regions 202 may be filled with silicon dioxide (as an example). The silicon dioxide may substantially cover the entire surface of pixel 200, as shown in FIG. 2. A shallow p+ doped region 204 may serve to passivate the walls and the bottom of STI regions 202. The surface of pixel 200 may be passivated by a p+ doped layer 231 to minimize dark current generation.

Pixel 200 may include a first n-type (n1-type) doped region 205, a second n-type (n2-type) doped region 224, and a p+ doped barrier 223 that separates region 205 from region 224. First doped region 205 and second doped region 224 may sometimes be referred to as a shallow implant region and a deep implant region, respectively. Implant regions 205 and 224 formed using the arrangement shown in FIG. 2 may be referred to as being vertically stacked. The shallow implant region 205 may serve as a shallow potential well for storing charge that is generated at smaller depths while the deep implant region 224 may serve as a deep potential well for storing charge that is generated at greater depths. Region 205 and region 201 located immediately below region 205 may form a first photodiode while region 224 and region 201 located immediate below region 224 may form a second photodiode.

First n-type doped region 205 may have a first associated depletion region delineated by depletion boundary (edge) 234. Second n-type doped region 224 may have a second associated depletion region delineated by depletion boundary 226. Barrier 223 is placed at a depth Xb under the surface of pixel 200. Pixels such as pixels 200 that have multiple doped regions (implants) buried in their substrates (i.e., pixels that have at least first and second photodiodes stacked vertically on top of one another) may sometimes be referred to as having stacked photodiode structures.

Pixel 200 has the ability to detect and store charge that has been generated at different depths according to the wavelength of incoming light. For example, blue light can be substantially absorbed by region 205, because blue light penetrates substrate 201 a certain distance that is less than depth Xb. Green light and red light may be absorbed by region 224. Because pixel 200 has potential well regions at different depths, pixel 200 may be able to separate charge generated from blue light and charge generated from green and red light.

To differentiate green light from red light, a color filter such as color filter 248 with a non-clear/clear/non-clear/clear pattern may be placed over a pixel subgroup that includes pixels 200. The filter may have a filter pattern that is 50% non-clear and 50% clear.

Figure 3:
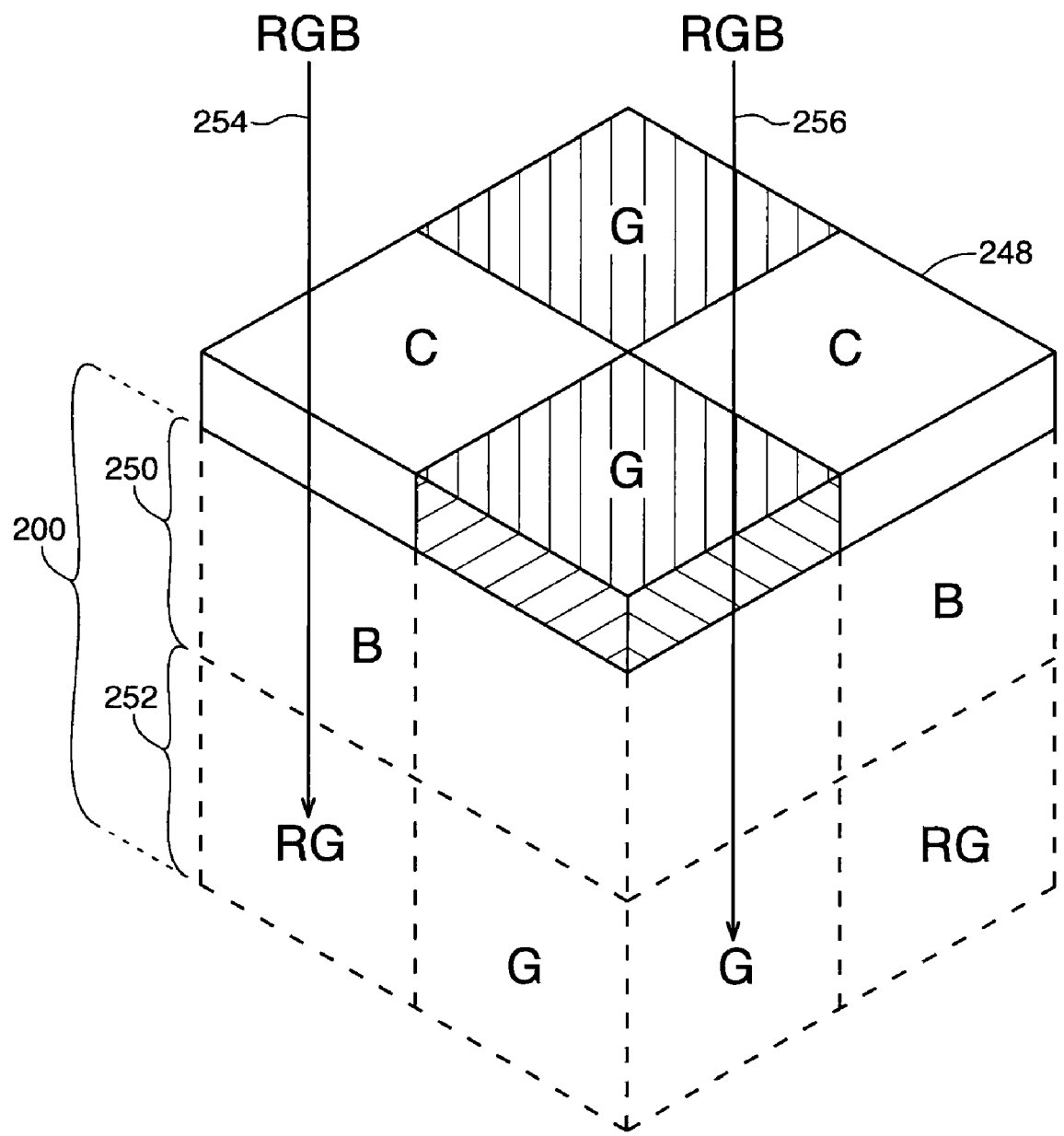
FIG. 3 is a perspective view of an image sensor pixel array showing how light may be absorbed through an illustrative color filter in accordance with an embodiment of the present invention.

Consider one suitable arrangement in which a GCGC (green-clear-green-clear) pattern is place over the pixel subgroup, as shown in FIG. 3. Each pixel formed under the green filters loses approximately 66% sensitivity, because one of three ranges of wavelengths is passed through each green color filter to a respective pixel. For example color filter 248 may receive incoming RGB (red-green-blue) light, as indicated by arrow 256. RGB light may include red light, green light, and blue light. Green light may pass through the green filters and may be absorbed in the deep potential wells located in region 252 of FIG. 3. Each pixel formed under the clear filter sacrifices no sensitivity, because all light is passed through. For example, color filter 248 may receive incoming RGB light, as indicated by arrow 254. The RGB light may pass through the clear filters, because the clear filters pass through all light. Blue light that passes through the clear filters may be absorbed in the shallow potential wells located in region 250 of FIG. 3. Red and green light that passes through the clear filters may be absorbed in the deep potential wells located in region 252. An image sensor formed using pixels 200 may therefore be able to exhibit increased sensitivity compared to conventional sensors that require more aggressive color filtering schemes as in the case with Bayer filter arrangements.

Consider another suitable arrangement in which a cyan-clear-cyan-clear pattern is place over the pixel subgroup. Each pixel formed under the cyan filters loses approximately 33% sensitivity, because one of three ranges of wavelengths is absorbed by each cyan color filter (e.g., blue and green light may pass through the cyan filters, and the blue light may be absorbed in the shallow potential wells located in region 250 while the green light may be absorbed in the deep potential wells located in region 252). Each pixel formed under the clear filter sacrifices no sensitivity, because all light is passed through.

Consider another suitable arrangement in which a MCMC (magenta-clear-magenta-clear) pattern is place over the pixel subgroup. Each pixel formed under the magenta filters loses approximately 33% sensitivity, because one of three ranges of wavelengths is absorbed by each magenta color filter (e.g., blue and red light may pass through the magenta filters, and the blue light may be absorbed in the shallow potential wells located in region 250 while the red light may be absorbed in the deep potential wells located in region 252). Each pixel formed under the clear filter sacrifices no sensitivity, because all light is passed through.

Filtering light using the cyan-clear-cyan-clear or the MCMC filter pattern may exhibit increased sensitivity over the GCGC pattern, because the cyan and magenta filters loses only 33% sensitivity instead of 66% sensitivity. If desired, any type of color filters (e.g., green, cyan, magenta, red, yellow, etc.) may be used as the non-clear filters.

Charge (electrons) 208 that are generated by impinging photons in the first depletion region (e.g., charge generated within depth Xb) may be collected and stored in region 205 of pixel 200. Charge (electrons) 211 generated in the second depletion region (e.g., charge generated within boundary 226) may be immediately swept into region 224 (i.e., the deep potential well). Charge (electrons) 210 generated below barrier 223 in an undepleted region of substrate 201 may diffuse up to edge 226 of the second depletion region and may be swept to the deep potential well (e.g., charge 210 may be swept into region 224).

Charge may be read out from pixel 200 using a three-phase process. In a first phase, a given transfer gate (Tx1) is activated to transfer charge from the shallow potential well to a floating diffusion (FD) node 206. In a second phase, the given transfer gate is turned on and an additional transfer gate (Tx3) is turned on to transfer charge from the deep potential well to a vertical charge transfer region 233 located under the additional transfer gate. In a third phase, the additional transfer gate is turned off to transfer charge (i.e., charge that has been transferred from the deep potential well) in vertical charge transfer region 233 to floating diffusion node 206.

For example, floating diffusion node 206 of pixel 200 may first be reset. After reset, transfer (Tx1) gate 207 (i.e., a floating diffusion region transfer gate) is turned on to transfer charge stored in the shallow potential well (e.g., charge stored in region 205) to floating diffusion node 206 for sensing. The transferred charge may be sensed and processed by the associated pixel circuits (not shown). Gate 207 may then be turned off and floating diffusion node 206 may again be reset.

Transfer (Tx1) gate 207 and transfer (Tx3) gate 209 (i.e., a vertical charge transfer region transfer gate) may then be turned on at the same time. This causes charge 228 that is stored in the deep potential well (e.g., charge stored in region 224) to be transfer through an n-type doped region 232 under gate 209 and be momentarily stored there as charge 229.

Transfer gate 209 may be turned off to transfer charge 229 to floating diffusion region 206 and sensed by the associated pixel circuit by turning on gate 207. This process can be repeated several times until all charge 228 is transferred to floating diffusion region 206 (e.g., transfer gate 209 may be turned on several times using several pulse signals to ensure that all charge 228 is read out). If desired, other sequences of readout and reset may be used.

Additional implants such as p-type doped region 227 and n-type doped region 232 may be placed under transfer gate 209 in vertical charge transfer region 233. Region 227 may be used to reduce dark current. Regions 227 and 232 may be used to provide a desired potential profile in substrate 201.

Additional p+ and p-type implants such as regions 237, 235, and 236 may be formed at the boundaries of each pixel 200 to prevent crosstalk (e.g., to prevent charge from spreading laterally between pixels).

Figure 4:
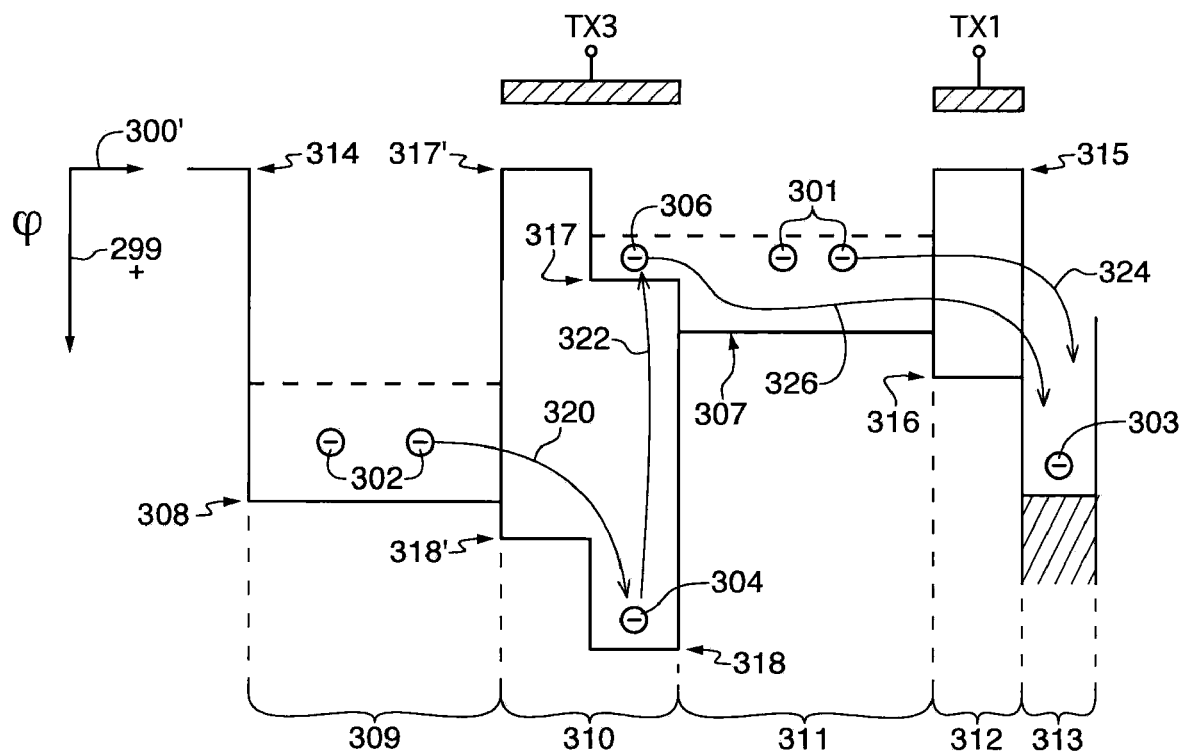
FIG. 4 is a lateral potential profile diagram of the illustrative photodiode of FIG. 2 that shows charge storage and charge transfer involved in reading data out of the photodiode in accordance with an embodiment of the present invention.

FIG. 4 illustrates the charge detection and charge transfer process in pixel 200. FIG. 4 is a lateral potential profile diagram showing the potential profile of pixel 200 along dotted line 300 in FIG. 2. FIG. 4 plots potential φ with increasing potential in the direction of arrow 299 against axis 300' (i.e., the potential profile is sampled along line 300).

Level 314 may represent a ground potential (e.g., zero volts). Level 308 may represent a potential level of the deep well while level 307 may represent a potential level of the shallow well. In this example, the shallow potential well (i.e., the well that is physically closer to the surface of the substrate) has a lower potential than the deep potential well. If desired, the shallow potential well may have a greater potential than the deep potential well.

The deep (bottom) potential well is shown as the region 309, the vertical charge transfer region under transfer (Tx3) gate 209 as region 310, the shallow (top) well potential well as region 311, the region under transfer (Tx1) gate 207 as region 312, and the floating diffusion region (i.e., the sensing node) as region 313.

Charge 301 generated by blue light may be integrated (collected) in the shallow well, as shown in region 311. Charge 302 generated by green and red light may be collected in the deep well, as shown in region 309. In a first phase, charge 301 may be read out from the shallow potential well through transfer gate 207 (Tx1). Gate 207 (Tx1) may be turned on to causes potential level 315 to increase to potential level 316. As a result, charge 301 is transferred to region 313, because electrons tend to flow towards regions of higher potentials (see, e.g., arrow 324). Transferring charge to FD region 313 in this way may cause the FD potential level to change. This change represents the desired signal that is sensed and processed by the pixel and sensor readout circuitry. After sensing, FD region 313 may be reset. Transfer gate 207 can also be turned off.

In a second phase, charge may be transferred from the bottom potential well to the top potential well via the vertical charge transfer region by turning on transfer (Tx1) gate 207 and transfer (Tx3) gate 209. When gate 209 is turned off, region 310 includes first and second potential levels, as indicated by levels 317' and 317. Levels 317' and 317 correspond to the potential levels of p-type substrate 201 and n-type doped region 232, respectively (see, e.g., the vertical portion of line 300 in FIG. 2).

Gate 209 may be turned on to cause levels 317' and 317 to change to levels 318' and 318, respectively. As a result, charge 302 that is stored in the deep well may be transferred into vertical charge transfer region 310 as charge 304 (see, e.g., arrow 320). Charge 304 may be temporarily stored in the n-type doped region 232 (FIG. 2) located under gate 209 at potential level 318.

When gate 209 (Tx3) is turned off, charge 304 may be transferred from level 318 to level 317 as charge 306 (as indicated by arrow 322). Charge 306 may then be read out to FD region 313 in the same way as charge 301, because transfer gate 207 is turned on during the second phase (see, e.g., arrow 326).

Figure 5:
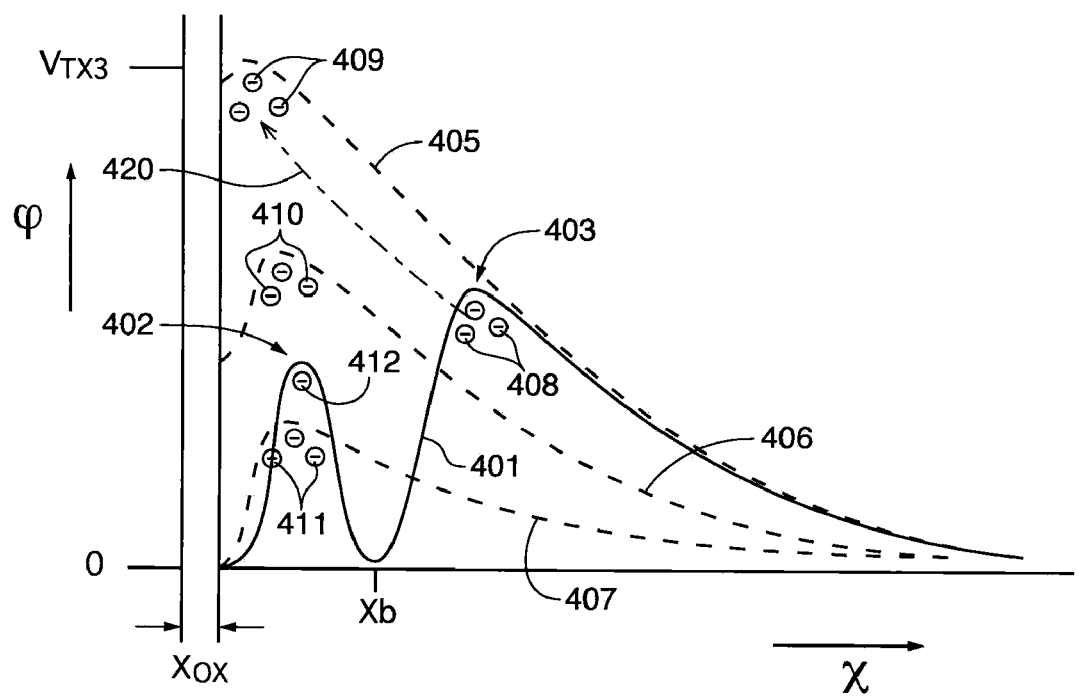
FIG. 5 is a vertical potential profile diagram of the illustrative photodiode of FIG. 2 that shows charge storage and charge transfer involved in reading data out of the photodiode in accordance with an embodiment of the present invention.

FIG. 5 further clarifies the charge transfer by plotting a vertical potential profile of pixel 200 along dotted lines 400 and 400' in FIG. 2. FIG. 5 plots potential φ against an x-axis in the direction that is perpendicular to the surface of substrate 201 and into substrate 201.

Curve 401 of FIG. 5 represents a potential profile curve in the center portion of the pixel away from the transfer gates (e.g., curve 401 represent the potential profile along dotted line 400 in FIG. 2). The shallow potential well may have a maximum potential level 402 while the deep potential well may have a maximum potential level 403, as shown in FIG. 5. Dotted curves 405, 406, and 407 represent the potential profile under transfer gate 209 (e.g., curves 405, 406, and 407 represent the potential profile along dotted line 400' in FIG. 2) for different gate voltage biases.

Charge may first be read out from the shallow potential well by turning on transfer gate 207, turning off gate 207, and resetting node 206. Gates 207 and 209 may then be turned on (e.g., gate 209 is biased at voltage level $V_{TX3}$, as shown in FIG. 5) to transfer charge 408 that is stored in deep potential well 403 to be stored as charge 409 under curve 405 (see, e.g., charge transfer as indicated by arrow 420).

In the process of turning off gate 209, charge may continue to be stored under gate 209. For example, charge may be stored as charge 410 under profile 406 when gate 209 is biased at $V_{TX3}/2$ (as an example). When the bias of gate 209 is sufficiently low, charge may be stored as charge 411 under profile 407. Charge 411 may then flow through potential well 402 (see, e.g., charge 412 in FIG. 5) and be transferred onto the FD node, because transfer (Tx1) gate 207 is turned on during this time.

The structure of pixel 200 may allow charge transfer from the deep potential well with a higher potential to a shallower potential well with a lower potential in a vertical direction. Sensing light in this way results in charge being stored for longer periods of time during the integration period in the silicon substrate in buried potential wells, resulting in a compact pixel structure with high performance, high charge storage well capacity, and minimum dark current generation. To further minimize dark current generation at the interface under the gate 209, gate 209 may be negatively biased during the charge integration period. Gate 209 may be negatively biased by 1.0 volt (as an example).

Various embodiments have been described illustrating image sensors that provide vertical charge transfer. The image sensors with vertical charge transfer capabilities may be used in any electronic device.

The image sensors may include image sensor pixels having stacked photodiodes formed in a substrate may be used to increase performance. In one embodiment, an image sensor pixel may include a stacked photodiode that has the ability to separate charge according to its depth of generation. The stacked photodiode may include a shallow implant (doping) region and a deep implant (doping) region. The shallow implant region may serve as a shallow potential well that stores charge generated within a given depth in the substrate while the deep implant region may serve as a deep potential well that stores charge generated at depths greater than the given depth in the substrate. The shallow implant region and the deep implant region may be separated by a potential barrier.

The shallow implant region may collect charge (electrons) that is generated by blue light. The deep implant region may collect charge (electrons) that is generated by red and green light.

The image pixel may include a floating diffusion region formed in the substrate and first and second transfer gates formed on the substrate. The first transfer gate may be used to transfer the charge stored in the shallow potential well to the floating diffusion region. The second transfer gate may be used to transfer the charge stored in the deep potential well to the shallow potential well via a vertical charge transfer region that is located under the second transfer gate in the substrate.

A color filter with a GCGC (green-clear-green-clear) pattern may be placed over the image pixels. Each pixel formed under the green filters may absorb green light (e.g., the corresponding photodiodes collect charge generated by the green light in the deep potential wells). Each pixel formed under the clear filters may absorb RGB (red-green-blue) light (e.g., the corresponding photodiodes collect charge generated by the blue light in the shallow potential wells and collect charge generated by the red and green light in the deep potential wells). Image sensors formed using non-clear/clear/non-clear/clear color filters (e.g., color filters with a cyan-clear-cyan-clear filter pattern, magenta-clear-magenta-clear filter pattern, green-clear-green-clear filter pattern, red-clear-red-clear filter pattern, etc.) may exhibit improved sensitivity over conventional image sensors that use the Bayer filter arrangement.

The foregoing is merely illustrative of the principles of this invention which can be practiced in other embodiments.

What is claimed is:

1. A stacked photodiode image sensor pixel in an image sensor array formed in a semiconductor substrate, comprising:
   a first photodiode formed using a first p-type doped region and a first n-type doped region;
   a second photodiode formed using a second p-type doped region and a second n-type doped region, wherein the first photodiode is stacked vertically above the second photodiode;
   a vertical charge transfer region transfer gate; and
   a vertical charge transfer region that is located below the vertical charge transfer region transfer gate and that is adjacent to the first and second photodiodes, wherein the vertical charge transfer region transfer gate assists in transferring charge collected in the second n-type doped region to the first n-type doped region through the vertical charge transfer region.

2. The stacked photodiode image sensor pixel defined in claim 1, further comprising:
   a floating diffusion region formed in the substrate; and
   a floating diffusion region transfer gate that assists in transferring charge collected in the first n-type doped region to the floating diffusion region.

3. The stacked photodiode image sensor pixel defined in claim 2, further comprising a given n-type doped region in the vertical charge transfer region, wherein the vertical charge transfer region transfer gate is turned on to transfer the charge collected in the second n-type doped region to the given n-type doped region for temporary storage and wherein the vertical charge transfer region transfer gate is turned off to transfer the charge temporarily stored in the given n-type doped region through the first n-type doped region to the floating diffusion region.

4. The stacked photodiode image sensor pixel defined in claim 2, further comprising pixel circuitry connected to the floating diffusion region, wherein the pixel circuitry resets the floating diffusion region and reads data out of the image sensor pixel.

5. The stacked photodiode image sensor pixel defined in claim 1, further comprising a given n-type doped region in the vertical charge transfer region, wherein the vertical charge transfer region transfer gate is turned on to transfer the charge collected in the second n-type doped region to the given n-type doped region for temporary storage and wherein the vertical charge transfer region transfer gate is turned off to transfer the charge temporarily stored in the given n-type doped region through the first n-type doped region to the floating diffusion region.

6. The stacked photodiode image sensor pixel defined in claim 1, further comprising a p+ doped potential barrier region formed between the first photodiode and the second photodiode.

7. The stacked photodiode image sensor pixel defined in claim 1, further comprising a p+ doped passivation layer formed over the first photodiode that minimizes dark current generation at the surface of the substrate.

8. The stacked photodiode image sensor pixel defined in claim 1, further comprising p-type implant regions that partially surround the first and second photodiodes and prevent pixel crosstalk.

9. An image sensor, comprising:
   a plurality of image sensor pixels; and
   a color filter array formed over the plurality of image sensor pixels, wherein the color filter array includes non-clear color filters and clear color filters, wherein each image sensor pixel in the plurality of image sensor pixels comprises:
      a first photodiode formed from a first p-type doped region and a first n-type doped region;
      a second photodiode formed from a second p-type doped region and a second n-type doped region, wherein the first photodiode is stacked vertically above the second photodiode;
      a vertical charge transfer region transfer gate; and
      a vertical charge transfer region that is located below the vertical charge transfer region transfer gate and that is adjacent to the first and second photodiodes, wherein the vertical charge transfer region transfer gate is used to transfer charge collected in the second n-type doped region to the first n-type doped region through the vertical charge transfer region.

10. The image sensor defined in claim 9, wherein each non-clear color filter comprises a selected one of: a cyan color filter, a magenta color filter, a green color filter, and a red color filter.

11. The image sensor defined in claim 9, wherein the image sensor pixels formed under the clear color filters are configured to detect blue light using their respective first photodiodes and wherein the image sensor pixels formed under the clear color filters are configured to detect red and green light using their respective second photodiodes.

12. The image sensor defined in claim 9, wherein the image sensor pixels formed under the non-clear color filters are configured to detect blue light using their respective first photodiodes and wherein the image sensor pixels formed under the non-clear color filters are configured to detect red or green light using their respective second photodiodes.

13. The image sensor defined in claim 9, wherein the image sensor pixels formed under the non-clear color filters are configured to detect red or green light using their respective second photodiodes.

* * * * *